United States Patent [19]
Momohara

[11] Patent Number: 5,825,783
[45] Date of Patent: Oct. 20, 1998

[54] SEMICONDUCTOR INTEGRATED CIRCUIT DEVICE WITH LARGE-SCALE MEMORY AND CONTROLLER EMBEDDED ON ONE SEMICONDUCTOR CHIP AND METHOD OF TESTING THE DEVICE

[75] Inventor: Tomomi Momohara, Yokohama, Japan

[73] Assignee: Kabushiki Kaisha Toshiba, Tokyo, Japan

[21] Appl. No.: 757,287

[22] Filed: Nov. 27, 1996

[30] Foreign Application Priority Data

Nov. 29, 1995 [JP] Japan .................................. 7-310619

[51] Int. Cl.$^6$ ...................................................... G06F 11/00
[52] U.S. Cl. .......................................................... 371/21.1
[58] Field of Search .................................. 371/21.1, 21.2, 371/21.3, 21.6; 365/201

[56] References Cited

U.S. PATENT DOCUMENTS 4,970,648  11/1990  Capots .

5,396,499  3/1995  Urai .

FOREIGN PATENT DOCUMENTS 82081216  8/1982  European Pat. Off. .

*Primary Examiner*—Vincent P. Canney
*Attorney, Agent, or Firm*—Loeb & Loeb LLP

[57] ABSTRACT

A semiconductor integrated circuit device comprises, on a semiconductor chip, a large-scale memory as a main memory, a controller for controlling at least inputting data from the outside of the chip to the large-scale memory, and outputting data from the large-scale memory to the outside of the chip, and a self-test circuit for testing the large-scale memory. The self-test circuit includes a rewritable EEPROM, into which a self-test sequence is written. The self-test circuit tests the large-scale memory in accordance with the self-test sequence written in the EEPROM.

20 Claims, 9 Drawing Sheets

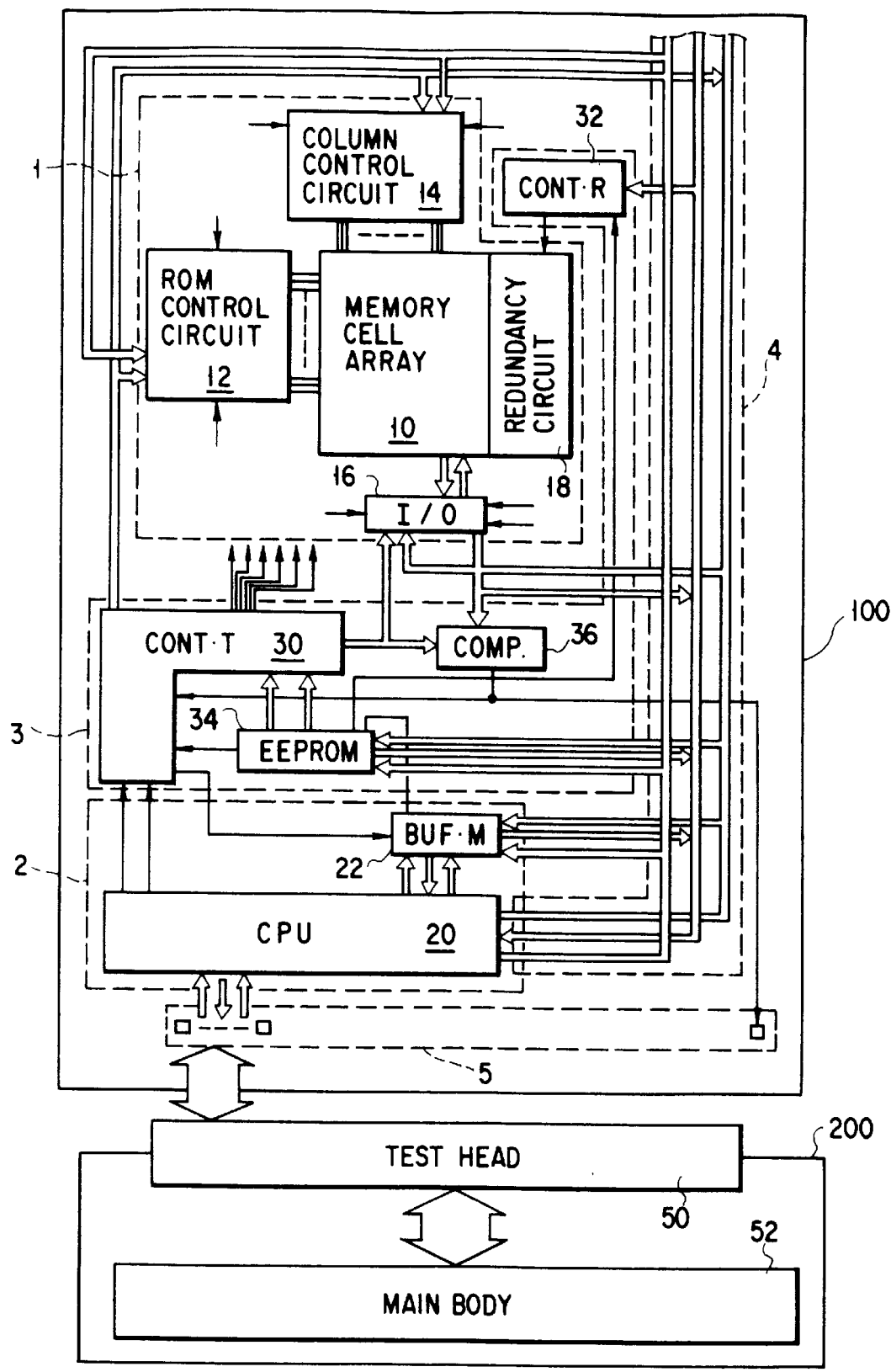
F I G. 1

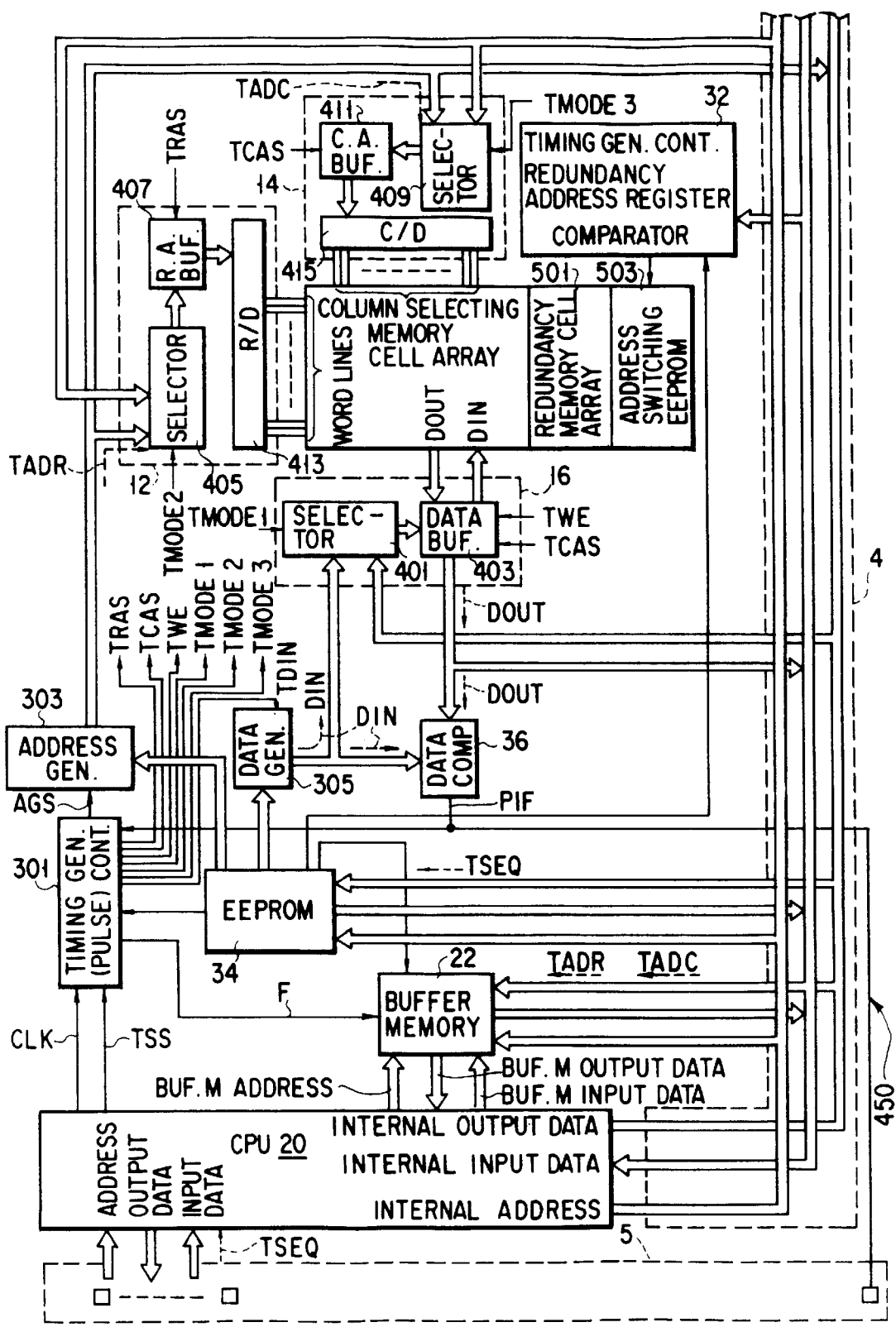
F I G. 2

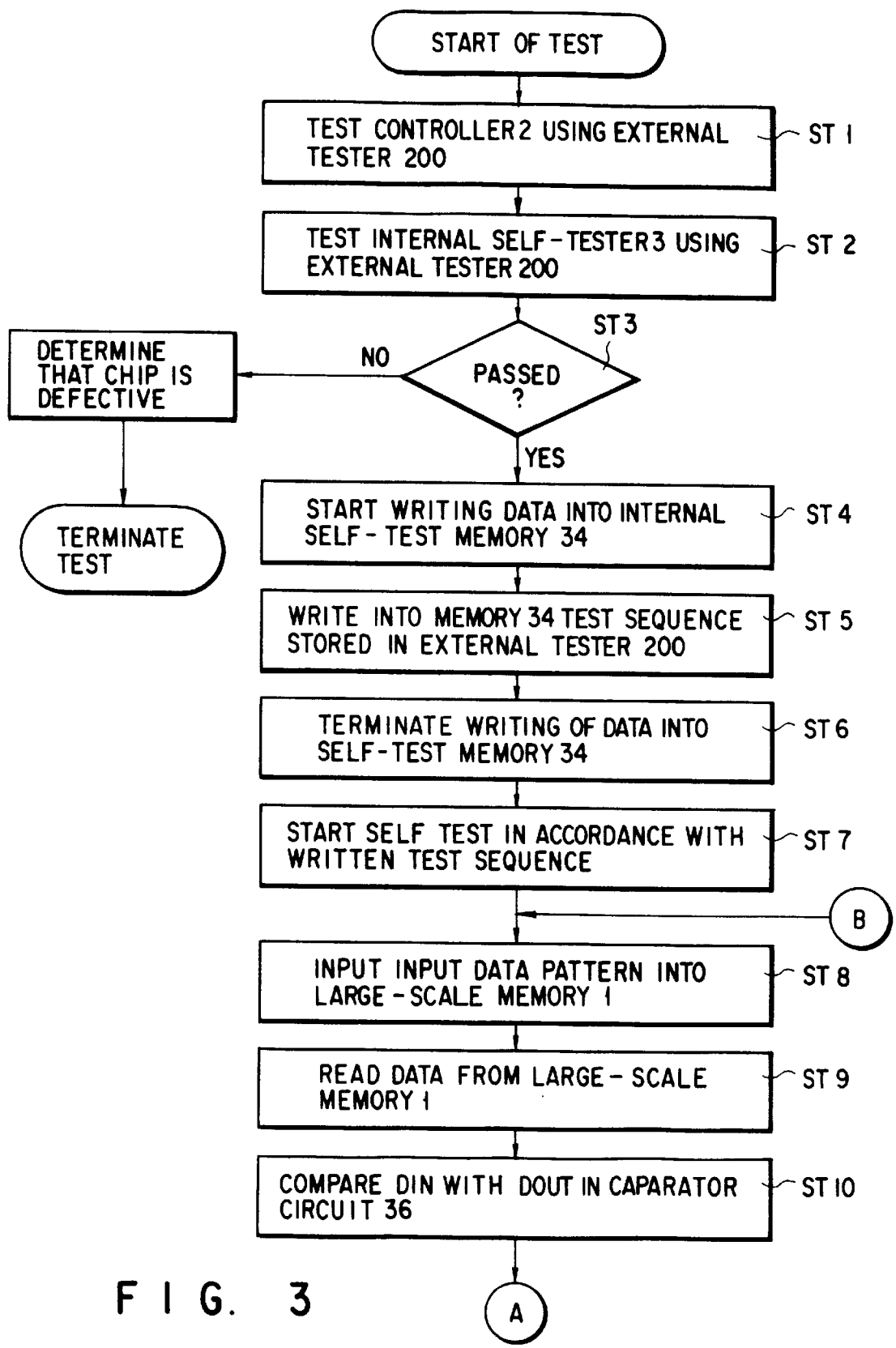
F I G. 3

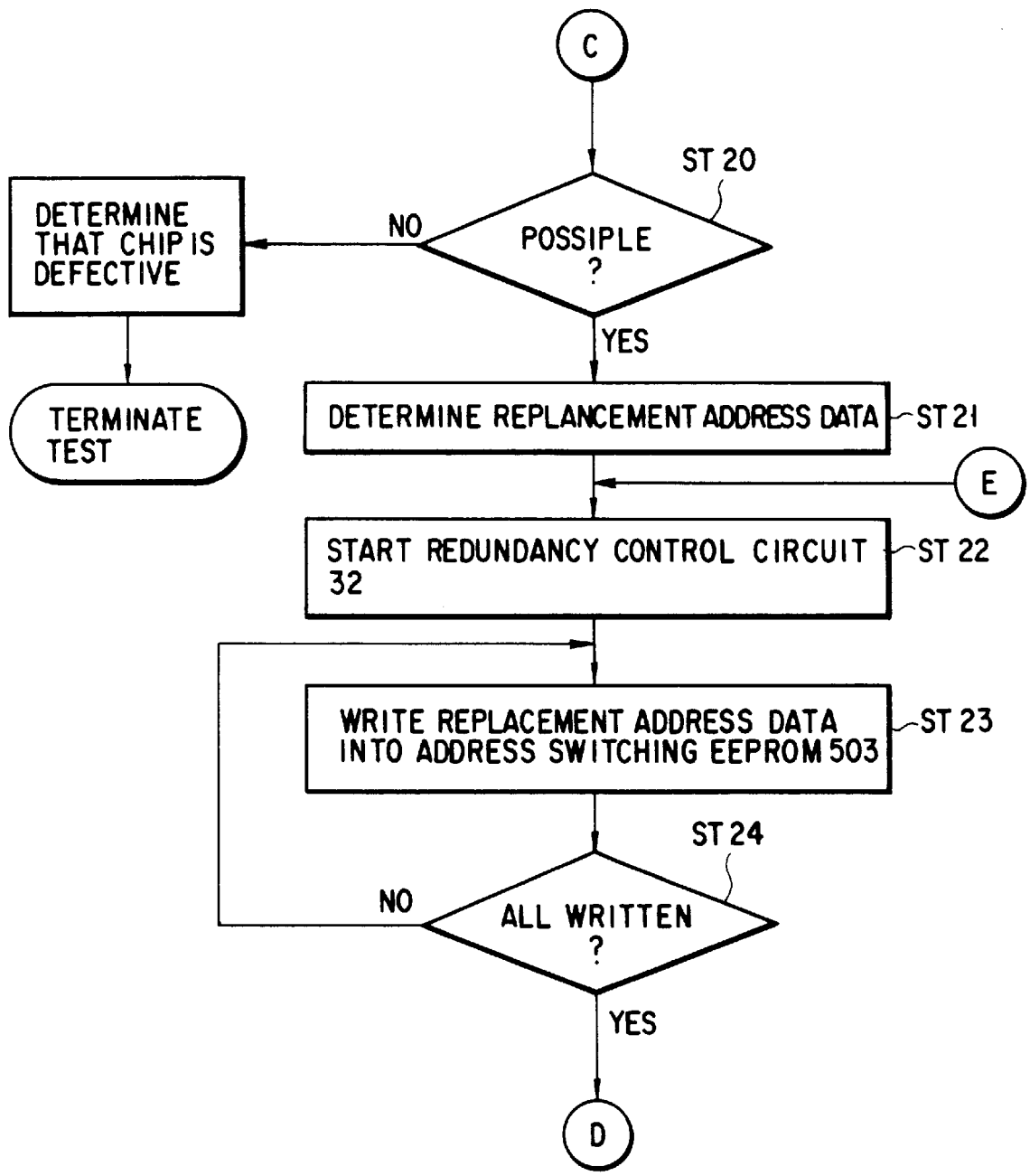
F I G. 5

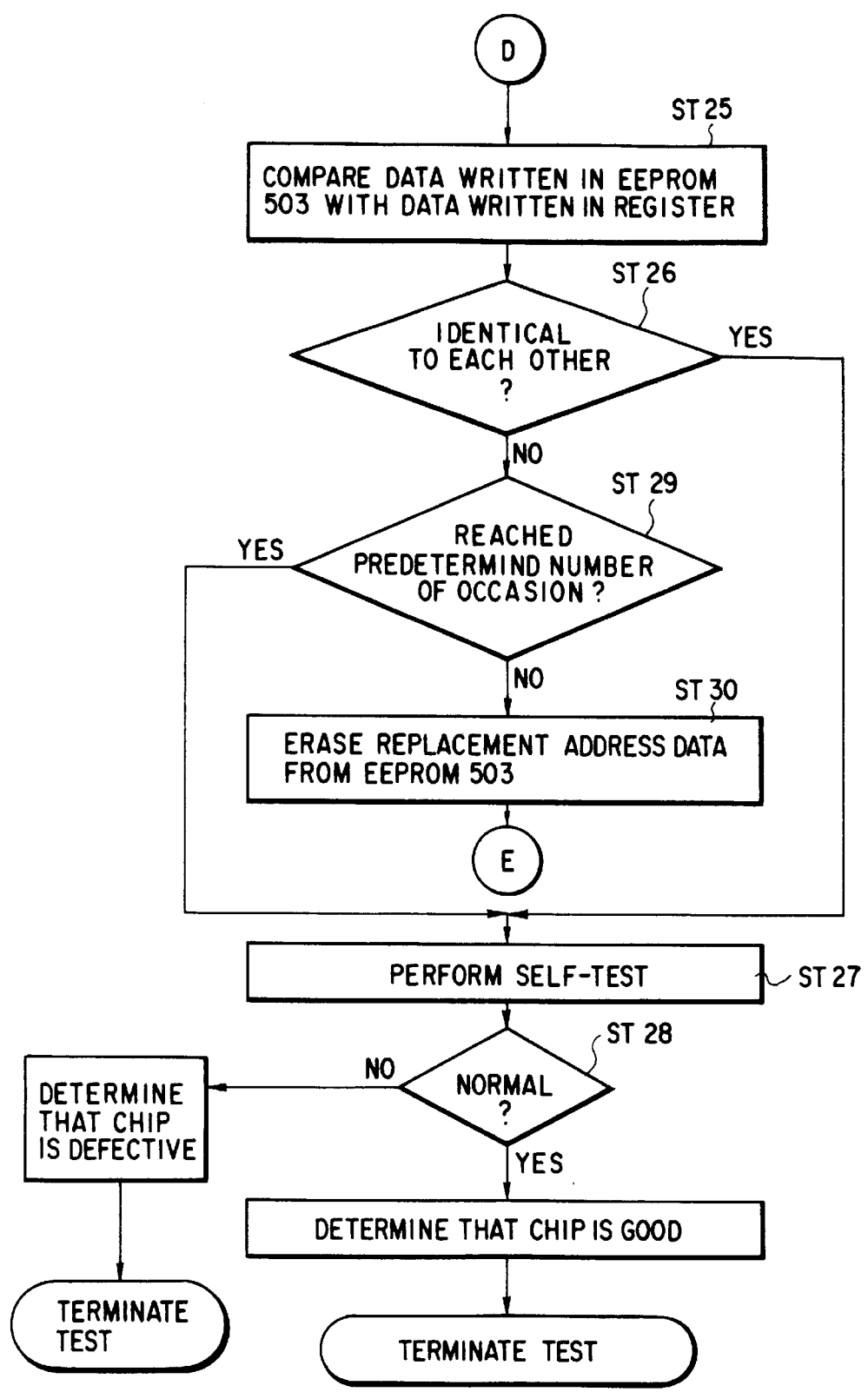
F I G. 6

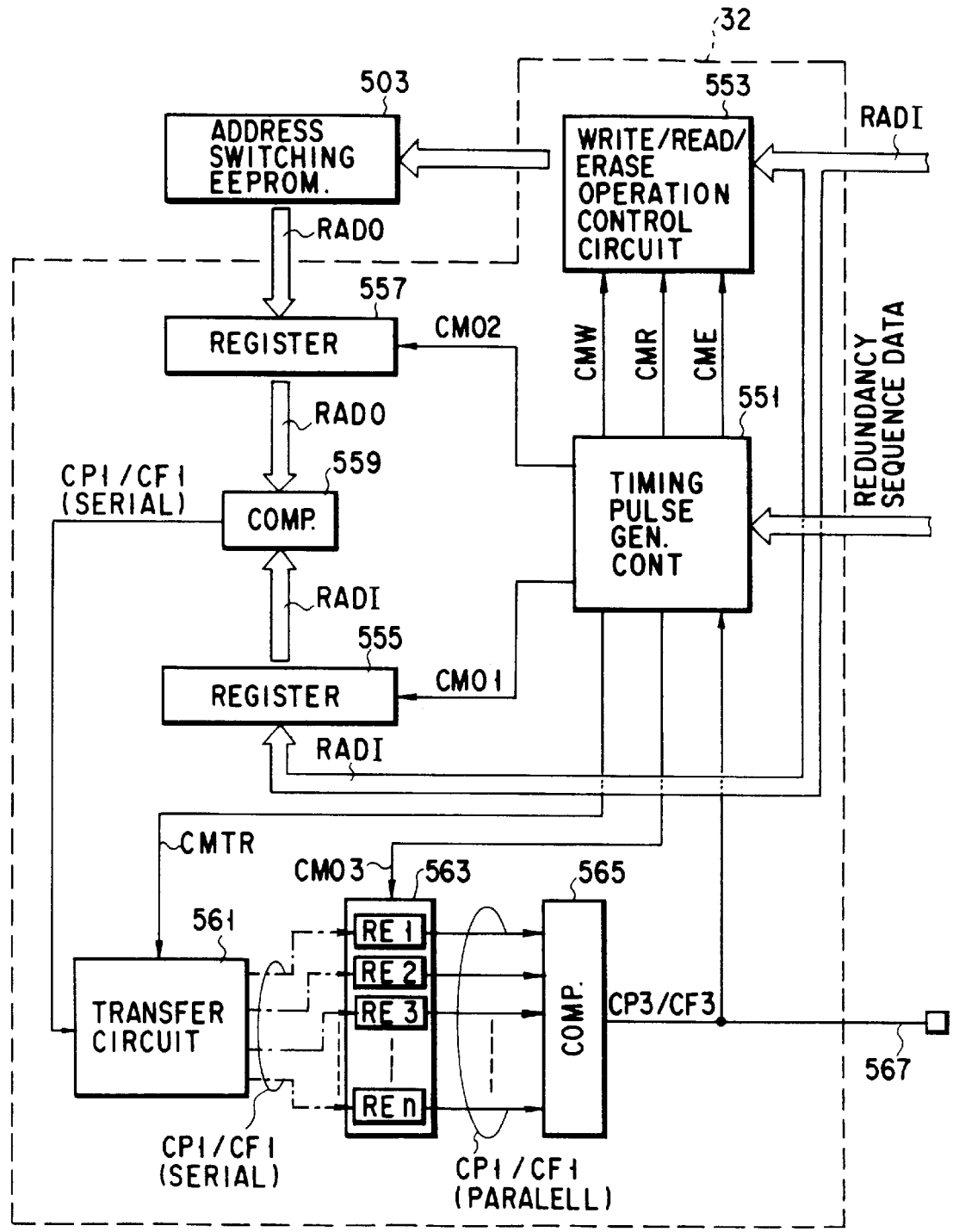
F I G. 7

SEMICONDUCTOR INTEGRATED CIRCUIT DEVICE WITH LARGE-SCALE MEMORY AND CONTROLLER EMBEDDED ON ONE SEMICONDUCTOR CHIP AND METHOD OF TESTING THE DEVICE

BACKGROUND OF THE INVENTION

1. Field of the Invention

This invention relates to a semiconductor integrated circuit device and a method of testing the device, in which device a main memory and a CPU for transferring data stored in the main memory to the outside of the device or for performing calculation on the basis of the data are formed on a single chip.

2. Description of the Related Art

The operation of LSI products for personal computers applicable, in particular, to multi-media techniques has remarkably been accelerated these days.

FIG. 8 is a schematic view, showing an LSI product for a personal computer.

As is shown in FIG. 8, a main memory 605 consisting of a plurality of megabit-order DRAMs 603 and having a megabyte-order memory capacity, and a controller 607 for controlling all the DRAMs 603 are provided on a circuit board 601. In this case, data is transferred from the main memory 605 at a speed falling within a range from 100 Mbyte/sec. to 300 Mbyte/sec. at maximum.

Further, a special LSI product has been developed, in which DRAMs are connected to a special controller via a special bus, and data can be transferred at a speed of 500 Mbyte/sec. at maximum.

FIG. 9 is a schematic view, showing the special LSI product.

As is shown in FIG. 9, there are provided, on a circuit board 701, a main memory 705 consisting of a plurality of megabit-order DRAMs 703 and having a megabyte-order memory capacity, a special controller 707 for controlling all the DRAMs 703, and a special bus 709 connecting the DRAMs to the controller 707.

As described above, LSI products recently developed for personal computers are of an external attachment type, in which a controller is connected to a memory on a circuit board.

However, it is expected difficult for the conventional external attachment type LSI products to realize data transfer with a speed of 1 gigabyte/sec. or more, which will be demanded in near future. In light of this, it is now proposed to realize data transfer with a speed of 1 gigabyte/sec. or more by forming both a controller and a main memory on a single chip to thereby, for example, reduce the bus length.

FIG. 10 is a schematic view, showing an LSI product having a controller and a main memory formed on a single chip.

As is shown in FIG. 10, there are provided, on a semiconductor chip 801, a main memory 803 consisting of integrated DRAM cells and having a megabyte-order memory capacity, a controller 805 for controlling the memory 803, and an internal bus 807 connecting the memory 803 to the controller 805.

Since, however, the LSI product shown in FIG. 10 (hereinafter referred to as a "controller/large-scale memory mixed type semiconductor integrated circuit device" or simply as a "mixed type integrated circuit device") is now being developed, a test method/system for testing the device has not yet been dealt with sufficiently.

Problems which may occur in a test method/system for the mixed type integrated circuit device will be described below.

(1) The mixed type integrated circuit operates at a very high speed. In particular, a great amount of data is transferred at an extremely high speed, and it is ambiguous whether an external tester can follow the transfer speed.

Even if there is tester hardware which can follow the operational speed of the device, it would be difficult to develop software capable of creating a test pattern which can simultaneously satisfy the design concept of a controller as a logic circuit and the design concept of a memory as a memory circuit, which differs from the former. Further, even if there is software capable of creating a test pattern which can simultaneously satisfy both design concepts, it would be very difficult to modify the software in accordance with improvements in process for manufacturing the mixed type integrated circuit device, since the degree of improvement differs between the logic circuit and the memory circuit.

To introduce such hardware and software, a great plant investment including a development cost is required.

(2) Even if such hardware and software are introduced, it is ambiguous whether the main memory can sufficiently be tested, since the input/output operation of the mixed type integrated circuit device is performed via the controller, and the main memory cannot be tested directly from the outside.

(3) Suppose that strict clear conditions are set so as to satisfactorily test the main memory by way of the controller. Then, it is highly possible that a great number of products will be considered defective and the yield of products will be reduced.

(4) It is considered to provide test pads for the main memory in order to test it directly from the outside. In the case of a megabyte-order main memory, however, a great number of test pads are necessary, which will inevitably make the chip size too large.

(5) Since the main memory has a megabyte-order capacity, a great amount of time is required for testing the unit, in particular, for redundancy processing, thereby reducing the throughput. This means degradation of production efficiency.

Although the production efficiency can be restored by providing multiple redundancy equipments (a laser blower, etc.) in the manufacturing line, an extra plant investment is required for the redundancy equipments.

SUMMARY OF THE INVENTION

This invention has been developed in light of the above-described problems.

It is a first object of the invention to provide a controller/large-scale memory mixed type semiconductor integrated circuit device which can be produced with a high yield, high production efficiency, and low plant investment, and also to provide a test method for testing the device.

It is a second object of the invention to provide a method for effectively using the controller/large-scale memory mixed type semiconductor integrated circuit device as the first object.

It is a third object of the invention to provide a controller/large-scale memory mixed type semiconductor integrated circuit device capable of testing itself without changing its circuit and manufacturing process, in accordance with self-test sequences included in software even if the software is modified.

It is a fourth object of the invention to provide a controller/large-scale memory mixed type semiconductor integrated circuit device having a logic circuit and a memory circuit which can be self-tested independently in accordance with self-test sequences included in software even if the software is modified, without changing its circuit and manufacturing process.

To attain the first object of the invention, there is provided a semiconductor integrated circuit device comprising: a semiconductor chip; a main memory provided on the chip; a controller provided on the chip for controlling at least inputting data from the outside of the chip to the main memory, and outputting data from the main memory to the outside of the chip; and a self-test circuit provided on the chip and having a memory into which a self-test sequence is written, the self-test circuit testing the main memory in accordance with the self-test sequence written in the memory.

To attain the second object of the invention, there is provided a method of using a semiconductor integrated circuit device having, on a semiconductor chip, at least a main memory; a controller for controlling at least inputting data from the outside of the chip to the main memory, and outputting data from the main memory to the outside of the chip; and a self-test circuit for testing the main memory in accordance with a self-test sequence written in a rewritable memory different from the main memory, the method comprising the steps of: erasing the self-test sequence from the rewritable memory after self-test processing is finished; and using the rewritable memory as a working memory after the self-test sequence is erased therefrom.

To attain the third object of the invention, there is provided a semiconductor integrated circuit device comprising: a semiconductor chip; a main memory provided on the chip; a calculation circuit provided on the chip for performing at least calculation on the basis of data stored in the main memory; a rewritable memory provided on the chip and different from the main memory; and a self-test circuit provided on the chip for writing a self-test sequence into the rewritable memory, and testing the main memory in accordance with the written self-test sequence.

To attain the fourth object of the invention, there is provided a method for testing a semiconductor integrated circuit device having, on a semiconductor chip, at least a main memory, a calculation circuit for performing at least calculation on the basis of data stored in the main memory, and a rewritable memory different from the main memory, the method comprising the steps of: testing at least the calculation circuit by an external tester; and writing a self-test sequence into the rewritable memory, and testing the main memory in accordance with the written self-test sequence.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram, showing a controller/large-scale memory mixed type semiconductor integrated circuit device according to the embodiment of the invention;

FIG. 2 is a block diagram, showing in more detail the controller/large-scale memory mixed type semiconductor integrated circuit device of FIG. 1;

FIG. 3 is a flowchart, useful in explaining part of a test process;

FIG. 5 is a flowchart, useful in explaining part of a test process;

FIG. 6 is a flowchart, useful in explaining part of a test process;

FIG. 7 is a block diagram, showing a redundancy control circuit 32;

DETAILED DESCRIPTION OF THE PREFERRED EMBODIMENTS

Figure 4:
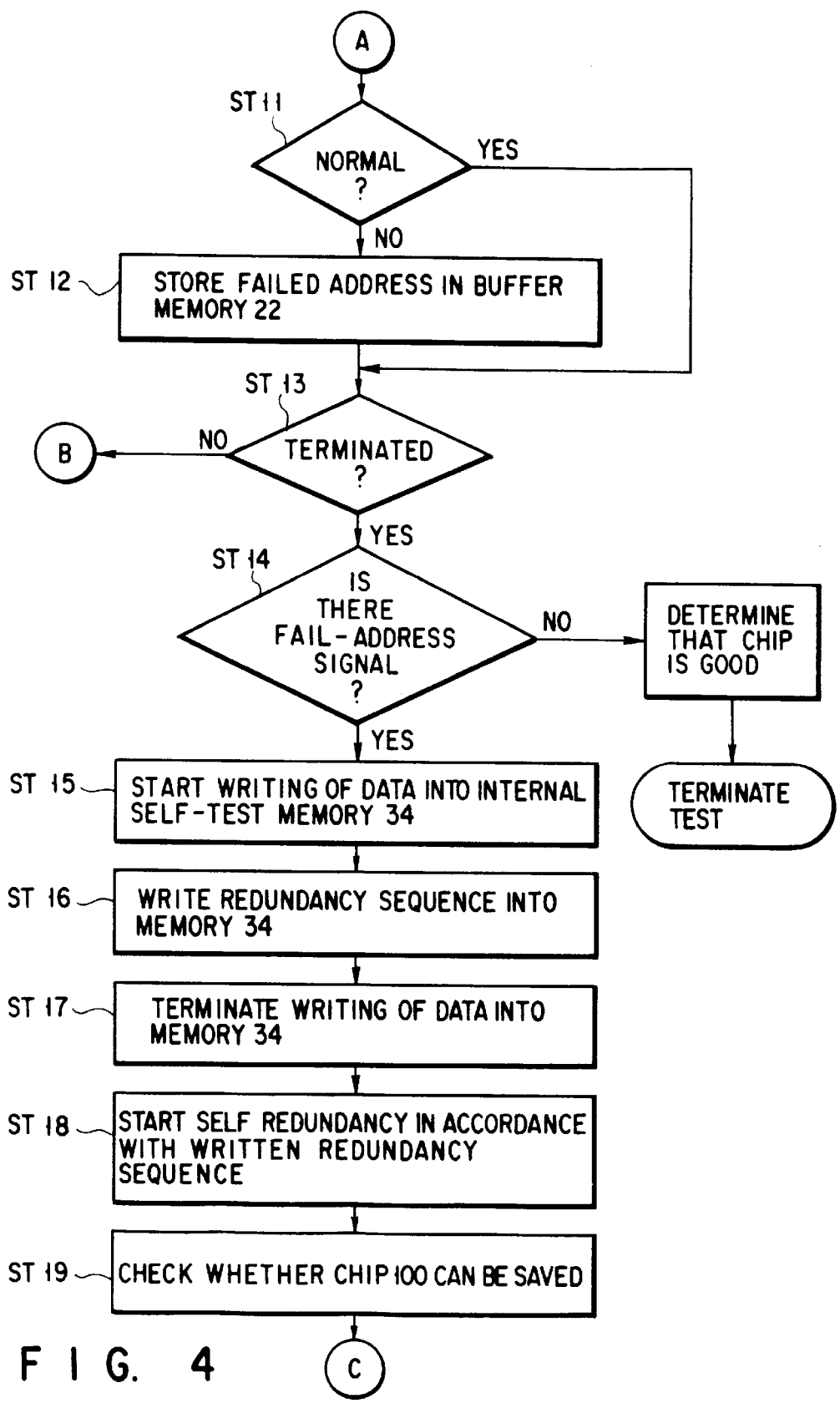
FIG. 4 is a flowchart, useful in explaining part of a test process.
Figure 9:
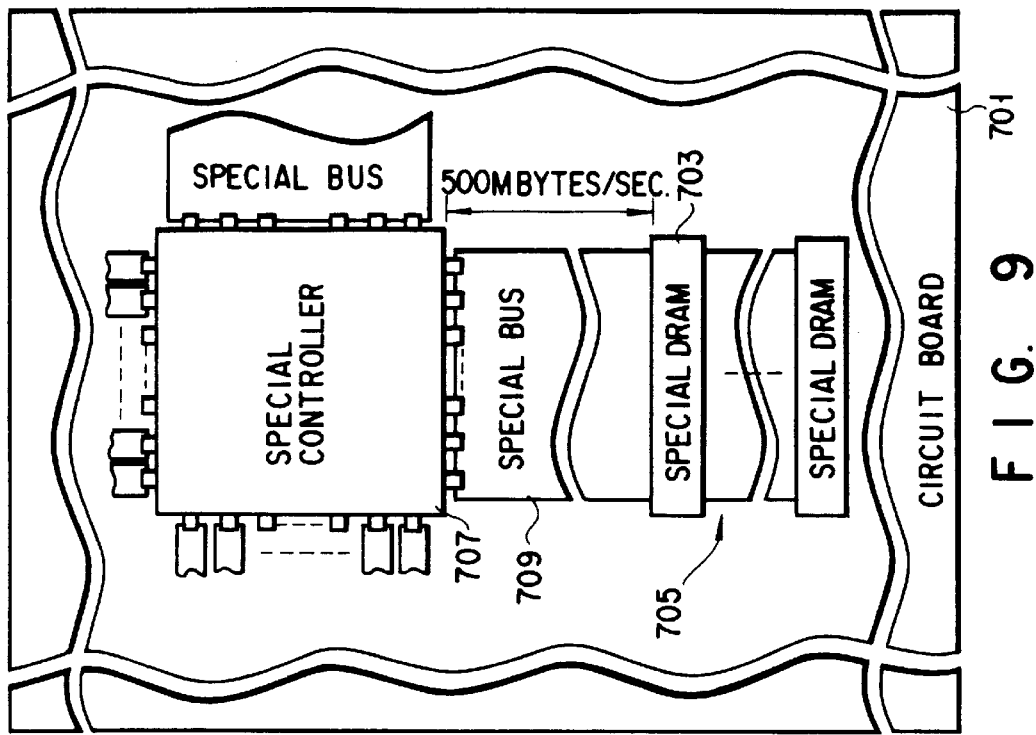
FIG. 9 is a schematic view, showing a special LSI product for personal computers.
Figure 8:
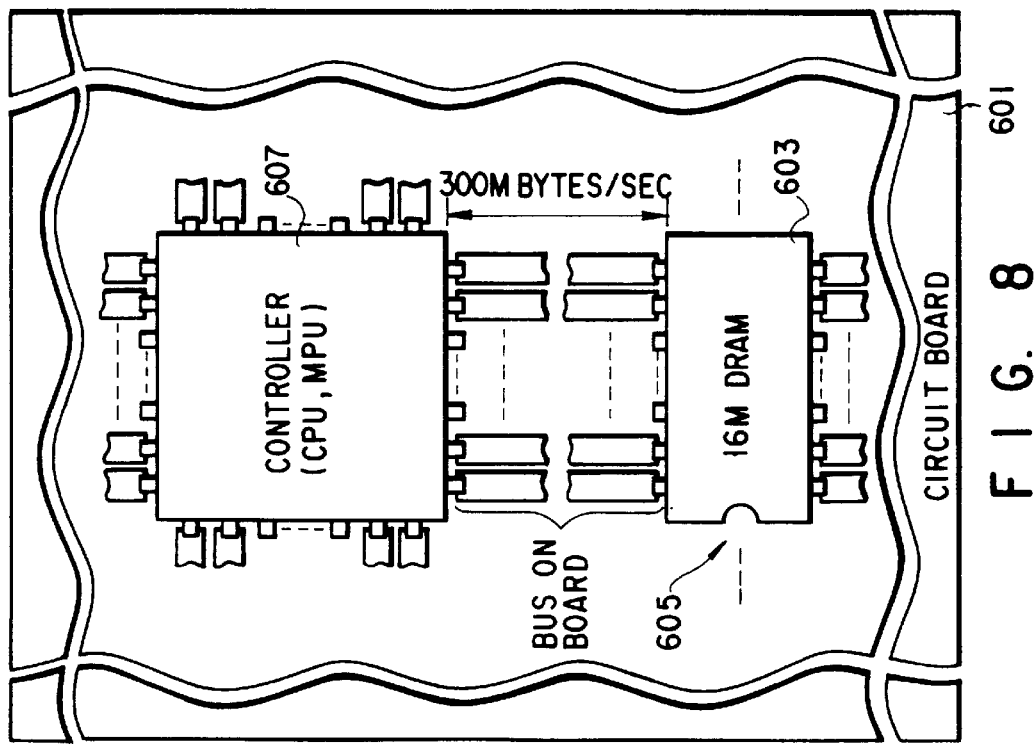
FIG. 8 is a schematic view, showing an LSI product for personal computers.
Figure 10:
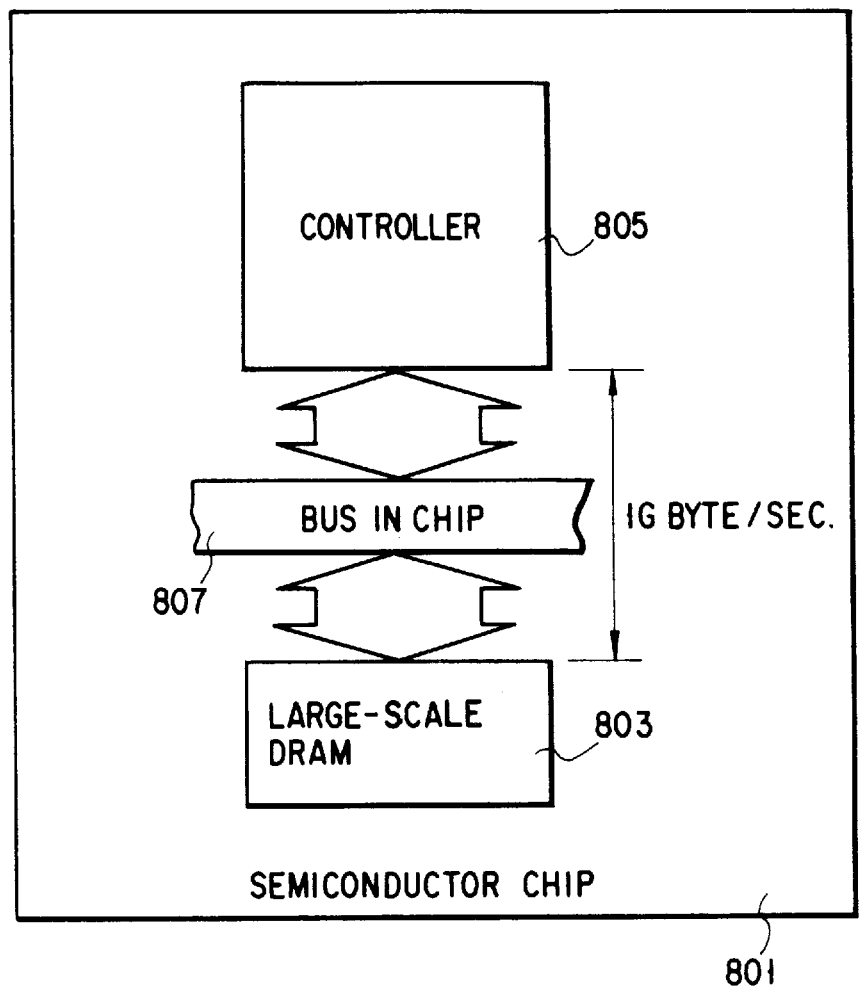
FIG. 10 is a schematic view, showing an LSI product having a controller and a main memory formed on a single chip.

A controller/large-scale memory mixed type semiconductor integrated circuit device according to the embodiment of the invention will be described in detail with reference to the accompanying drawing.

FIG. 1 is a block diagram, showing the controller/large-scale memory mixed type semiconductor integrated circuit device of the embodiment.

As is shown in FIG. 1, the integrated circuit device of the embodiment is mainly divided into three blocks. One of the blocks consists of a large-scale memory 1 as a main memory with a megabyte-order capacity. Another of the blocks consists of a controller 2 for controlling at least input of data from the outside of a chip 100 to the large-scale memory 1, and output of data from the memory 1 to the outside of the chip 100. The other of the blocks consists of a self-tester 3 for testing and redundancy control the memory 1 itself. These blocks are connected to each other directly or by means of an internal bus line 4. In addition to the three blocks, external pads 5 are provided on the chip 100 and used as contacts between the outside and the inside of the chip 100.

The large-scale memory 1 comprises a memory cell array 10 consisting of memory cells arranged in rows and columns, a row control circuit 12 including a row decoder for selecting one of the rows of the array 10, a column control circuit 14 including a column decoder for selecting one of the columns of the array 10, an input/output (I/O) circuit 16 including a data buffer circuit for inputting and outputting data, and a redundancy circuit 18 including a preparatory memory cell, a preparatory decoder, a fuse circuit for address replacement, etc. for saving a defective cell.

The memory cells integrated in the memory cell array 10 are constituted by dynamic memory cells, and each of the row control circuit 12, the column control circuit 14 and the data buffer circuit 16, etc. is constituted by a combination of logic circuits.

The memory cells of the redundancy circuit 18 are constituted by dynamic memory cells as in the case of the memory cell array 10, while the preparatory decoder is constituted by a combination of logic circuits as in the case of the row control circuit 12 and the column control circuit 14. Moreover, the fuse circuit of the redundancy circuit 18 is constituted by an EEPROM (Electrically Erasable and Programmable ROM), in particular, a flash EEPROM, for performing self-redundancy processing, although in a usual memory, the fuse circuit employs a laser blow fuse.

The controller 2 includes a central processing unit (CPU) 20 for transferring data between the outside and the inside of the device and controlling the operations of the inside circuits of the device, and a buffer memory (BUF.M) 22 for temporarily storing data during processing.

The CPU 20 is basically constituted by a combination of logic circuits, and the buffer memory 22 of a static memory such as a latch circuit.

The self-tester 3 includes a self-test control circuit (CONT.T) 30 for controlling self-test processing, a self-redundancy control circuit (CONT.R) 32 for controlling self-redundancy processing, a self-test memory (EEPROM) 34 storing test sequence data used by the test control circuit 30, redundancy sequence data used by the redundancy control circuit 32, etc., and a data comparison circuit (COMP.) 36 for comparing data output from the self-test memory 34 with data output from the large-scale memory 1, thereby judging the test result.

Each of the test control circuit 30, the redundancy control circuit 32 and the data comparison circuit 36 is constituted by a combination of logic circuits as in the case of the CPU 20, while the self-test memory 34 is constituted by an EEPROM (Electrically Erasable and Programmable ROM), in particular, a flash EEPROM, differing from the case of the buffer memory 22.

A method for testing the controller/large-scale memory mixed type semiconductor integrated circuit device according to the embodiment of the invention will now be described.

FIGS. 3–6 are flowcharts, illustrating test processes.

Each of the test processes of the invention includes a process step for testing the integrated circuit device using an external tester connected to the chip 100, and a process step for testing it using the self-tester 3 incorporated in the chip 100.

FIG. 1 shows a state in which the chip 100 is connected to an external tester 200.

As is shown in FIG. 1, the external tester 200 includes a test head 50 to be connected to the chip 100, and a tester main body 52 for supplying the chip 100 with a test pattern via the test head 50 in accordance with a test sequence, then receiving a response from the chip 100 via the test head 50, and comparing the response with an expected value to judge the same.

The controller 2 and the internal self-tester 3 are examined by connecting the external tester 200 constructed as above to the chip 100.

First, the controller 2 is examined by the external tester 200 (step ST.1 in FIG. 3). More specifically, the CPU 20 and the buffer memory 22 incorporated in the controller 2 are examined individually. They are subjected to various tests. These tests mainly include three basic tests—a direct current characteristic test, an alternative current characteristic test (timing characteristic test), and a function test.

Thereafter, the internal self-tester 3 is examined using the external tester 200 (step ST.2 in FIG. 3). Also in this case, the control circuits 30 and 32, the comparison circuit 36 and the self-test memory 34 incorporated in the self-tester 3 are individually subjected to the above-mentioned three basic tests.

Then, the external tester 200 determines whether the controller 2 and the internal self-tester 3 have passed the tests or failed in them (step ST.3 in FIG. 3). If both the controller 2 and the internal self-tester 3 are determined to have passed the tests (i.e. if the answer to the question of the step ST.3 is YES), then they are subjected to self-test processing. If, on the other hand, at least one of the controller 2 and the self-tester 3 is determined to have failed in the tests (i.e. if the answer to the question of the step ST.3 is NO), it is determined that the chip 100 is defective, thereby terminating the external test process and removing the chip 100 from the next self-test process.

The self-test process will now be described.

The self-test process includes two main steps—the step of specifying a defective cell in the large-scale memory 1, and the step of saving the defective cell. Each of the specification step and the saving step includes the step of writing a test sequence or a redundancy sequence, and the step of executing the written test sequence and redundancy sequence.

FIG. 2 is a block diagram, showing in more detail the integrated circuit of FIG. 1.

In the self-test processing, the external tester 200 is used as a source of data to be written. The data to be written is input from the external tester 200 to the chip 100 via the test head 50, and the input data is sequentially written into the self-test memory 34.

Specifically, first, the CPU 20 receives a write start signal from the external tester 200, and starts to write data into the self-test memory 34 (step ST.4 in FIG. 3). Subsequently, a test sequence signal TSEQ is input from the external tester 200 to the chip 100, and the input test sequence signal TSEQ is written into the self-test memory 34 (step ST.5 in FIG. 3). The test sequence signal TSEQ includes data necessary for the self-test, such as an input data pattern for the self-test, an address creating pattern, etc.

Thereafter, the CPU 20 receives a write finish signal from the external tester 200, and finishes the data write processing (step ST.6 in FIG. 3).

Then, the self-test is performed.

The items of the self-test mainly include an alternate current characteristic test (timing characteristic test) for the large-scale memory 1, and a function test for the memory 1. Through these tests, a defective cell is extracted from a large number of memory cells formed in the memory cell array 10.

Specifically, first, the CPU 20 outputs a self-test start signal TSS, thereby starting self-test processing based on the test sequence signal TSEQ (step ST.7 in FIG. 3). The test start signal TSS is supplied to the self-test control circuit 30, etc. More specifically, the test start signal TSS is supplied to a timing pulse generating/controlling circuit 301 incorporated in the self-test control circuit 30, as is shown in FIG. 2. The timing pulse generating/controlling circuit 301 operates in synchronism with an internal clock signal CLK output from the CPU 20.

The timing pulse generating/controlling circuit 301 is responsive to the test start signal TSS from the CPU 20 for outputting an address generation start signal AGS, a data generation start signal TDIN, and test control signals used to control the large-scale memory 1. The test control signals include operation control signals, such as a row address strobe signal (RAS), a column address strobe signal (CAS), a write enable signal (WE), etc., which correspond to signals for controlling the operation of the memory at the time of normal operation, and also include test mode signals.

Subsequently, an input data pattern DIN is input to the large-scale memory 1 (step ST.8 in FIG. 3). Specifically, a data generation circuit 305 responds to the data generation start signal TDIN, and generates an input data pattern corresponding to an input data pattern stored in the memory 34.

An example of an input operation of the input data pattern DIN will be described.

The input data pattern DIN is supplied to the data comparison circuit 36 and the input/output circuit 16, respectively. Specifically, the pattern DIN is input to a selector 401 incorporated in the input/output circuit 16.

The selector 401 supplies the input data pattern DIN to a data buffer 403 when a test mode signal TMODE1 designates a test mode and also a write mode is set.

An address generation circuit 303 is responsive to the address generation start signal AGS for outputting test address signals on the basis of an address generation pattern stored in the memory 34. A test row address signal TADR included in the test address signals and corresponding to the row address is input to a selector 405 incorporated in the row control circuit 12, while a test column address signal TADC included in the test address signals and corresponding to the column address is input to a selector 407 incorporated in the column control circuit 14.

The selector 405 supplies the test row address signal TADR to a row address buffer 409 while a test mode signal TMODE2 designates a test mode. Similarly, the selector 407 supplies the test column address signal TADC to a column address buffer 411 while a test mode signal TMODE3 designates a test mode.

The data buffer 403 responds to those signals TWE and TCAS included in the test control signals, which correspond to the write enable signal (WE) and the column address strobe signal (CAS), respectively, and selects the write mode from the write mode and a read mode, thereby supplying an input test pattern TPTI to the memory cell array 10 via a read/write data line.

The row address buffer 407 responds to a signal TRAS included in the test control signals, which correspond to the row address strobe signal (RAS), and supplies a row decoder (R/D) 413 with the test row address signal. The row decoder 413 in turn decodes the supplied test row address signal, thereby driving a word line to be driven.

On the other hand, the column address buffer 411 responds to the signal TCAS and supplies the column decoder (C/D) 415 with the test column address signal. The column decoder 415 in turn decodes the supplied test column address signal, thereby selecting a column selecting line to be selected.

Thus, that one of the multiple memory cells, which is situated at the intersection of the driven word line and a bit line (not shown) connected to the selected column selecting line, is selected. The input data pattern DIN is input to the selected memory cell, i.e. data based on the input data pattern DIN is written into the selected memory cell.

After the data based on the data pattern DIN is written, the written data is read from the memory 1 in order to examine its state (step ST.9 in FIG. 3). To read the written data, the above-described row and column selection is performed to select the memory cell, and then the signals TWE and TCAS are controlled, thereby setting the data buffer circuit 403 to the read mode. As a result, data DOUT is read from the selected memory cell. The data DOUT is supplied to the data comparison circuit 36.

To determine whether or not the read data DOUT is normal, the data DOUT is compared with the input data pattern DIN in the comparison circuit 36 (step ST.10 in FIG. 3). In accordance with the comparison result, the comparison circuit 36 outputs, as a determination signal P/F, a "Pass" signal indicating that the data is normal or a "Fail" signal indicating the data is abnormal.

The determination signal P/F is supplied to the timing pulse generating/controlling circuit 301 and also to a monitor line 450. The monitor line 450 is connected to an external pad. Although the monitor line 450 is not necessarily required, it enables the operator to know from the outside of the chip 100, during self-test processing, whether or not the chip 100 is defective, by generating the determination signal P/F.

The test address signals TADR and TADC are supplied to the selectors 405 and 407, and also to the buffer memory 22 via the internal data line of the internal bus line 4.

Thereafter, it is determined on the basis of the comparison result from the comparison circuit 36 whether or not the read data DOUT is normal (step ST.11 in FIG. 4).

If it is determined in the step ST.11 that the data is abnormal (i.e. if the answer to the question in the step ST.11 is NO), the timing pulse generating/controlling 301 responds to the determination signal F indicative of the abnormal state, and supplies a signal F, for example, of a "H (high)" level to the buffer memory 22. Upon receiving the "H" level signal, the buffer memory 22 stores the supplied test address signals TADR and TADC as "fail address" signals (step ST.12 in FIG. 14).

On the other hand, if it is determined in the step ST.11 that the data is normal (i.e. if the answer to the question in the step ST.11 is YES), the timing pulse generating/controlling 301 responds to the determination signal F indicative of the normal state, and supplies a signal F, for example, of a "L (low)" level to the buffer memory 22. Upon receiving the "L" level signal, the buffer memory 22 does not store the supplied test address signals TADR and TADC.

The above-described test processing is repeated until all the memory cells have been examined (step ST.13 in FIG. 14). During self-test processing, fail address signals are sequentially stored in the buffer memory 22.

After all the memory cells are examined, it is determined whether or not there is a fail address signal (step ST.14 in FIG. 14). If there is no fail address signal (if the answer to the question in the step ST.14 is NO), it is determined that the chip 100 is not defective, thereby terminating the self-test process and removing the chip from the next self-redundancy process.

If there is a fail address signal (i.e. if the answer to the question in the step ST.13 is YES), the chip 100 is subjected to the self-redundancy process using the redundancy circuit 18 and self-redundancy control circuit 32.

The CPU 20 starts writing data output from the external tester 200, into the self-test memory 34 (step ST.15 in FIG. 4). Subsequently, a redundancy sequence is input from the external tester 200 to the chip 100, and then written into the self-test memory 34 via the CPU 20 (step ST.16 in FIG. 14). The redundancy sequence includes programs necessary for saving the chip using the redundancy circuit 18, such as a control sequence, a sequence of replacing a row or a column with a redundancy row or a redundancy column, etc.

Then, the CPU 20 receives a write termination signal from the external tester 200, thereby terminating the writing of data (step ST.17 in FIG. 4).

Thereafter, the processing is shifted to self-redundancy processing.

The CPU 20 starts self-redundancy processing in accordance with the written redundancy sequence (step ST.18 in FIG. 4).

First, it is determined in a step ST.19 (in FIG. 4) whether the chip 100 can be saved using redundancy rows and redundancy columns incorporated in a redundancy cell array 501, in accordance with a sequence of cell replacement included in the redundancy sequence and on the basis of the fail address signals stored in the buffer memory 22. This determination is performed by, for example, a calculation function of the CPU 20.

If, for example, the number of rows or columns to be saved is greater than that of redundancy rows or columns included in the redundancy cell array 501, it is determined in the step ST.19 that the chip cannot be saved.

If it is determined in a step ST.20 (in FIG. 5) that the chip cannot be saved (i.e. if the answer to the question in the step ST.20 is NO), the chip 100 is determined to be defective, thereby terminating the test and removing the chip 100 from the next process for replacing defective cells.

If, on the other hand, it is determined in the step ST.20 that the chip can be saved (i.e. if the answer to the question in the step ST.20 is YES), the CPU 20 determines address data for replacing defective cells, on the basis of fail address data stored in the buffer memory 22 and the replacement sequence written in the self-test memory 34 (step ST.21 in FIG. 5). The thus-determined replacement address data is temporarily stored in the buffer memory 22.

Then, the CPU 20 controls the self-redundancy control circuit 32 so as to operate in accordance with a control sequence included in the redundancy sequence (step ST.22 in FIG. 5).

Subsequently, the CPU 20 controls the self-redundancy control circuit 32 so as to write, into an address replacement EEPROM 503, the replacement address data temporarily stored in the buffer memory 22 (step ST.23 in FIG. 5).

The above-described self-redundancy processing is repeated until the replacement address data is written into all cells of the address replacement EEPROM 503 (step ST.24 in FIG. 5).

If it is determined that the replacement address data has been written into all cells of the address replacement EEPROM 503 (i.e. if the answer to the question in the step ST.24 is YES), the data written in the EEPROM 503 is compared with data stored in a redundancy address register by a comparison circuit (step ST.25 in FIG. 6). The redundancy address register and the comparison circuit are incorporated in the redundancy control circuit 32.

If in a step ST.26 (in FIG. 6), it is determined as a result of the comparison that all data written in the EEPROM 503 is identical to that written in the redundancy address register (i.e. if the answer to the question in the step ST.26 is YES), it is determined that replacement of defective addresses has succeeded. Then, the above-described self-test processing is again performed (step ST.27 in FIG. 6) to thereby determine whether or not the large-scale memory 1 after the save processing is normal (step ST.28 in FIG. 6). If it is normal (i.e. if the answer to the question in the step ST.28 is YES), the chip 100 is determined to be a "good product", thereby terminating the test.

If, on the other hand, the memory 1 is determined abnormal (i.e. if the answer to the question in the step ST.28 is NO), the chip 100 is determined to be a "defective product", thereby terminating the test.

Further, unless it is determined in the step ST.26 in FIG. 6 that all data written in the EEPROM 503 is identical to that written in the redundancy address register, i.e. if the answer to the question in the step ST.26 is NO, it is determined highly possible that replacement of defective addresses has failed. In this case, the program proceeds to a step ST.29 in FIG. 6, where it is determined whether or not the number of occasions of data rewriting in the EEPROM 503 reaches a predetermined value. If it does not reach the predetermined value (i.e. if the answer to the question in the step ST.29 is NO), the replacement address data is erased from the EEPROM 503 in a step ST.30 in FIG. 6, and then the program returns to the step ST.22 in FIG. 5, where the replacement address data is rewritten into the EEPROM 503.

If the number of occasions of data rewriting in the EEPROM 503 reaches the predetermined value, it may be determined that the chip is a "defective product". At this time, however, the above-described self-test processing may be again performed, instead of determining that the chip is defective. This is because there is a rare case where the chip can be considered normal even if data written in the EEPROM 503 is not entirely identical to that written in the redundancy address register. This processing also contributes to an increase in yield of products.

FIG. 7 is a block diagram, showing an example of a self-redundancy control circuit.

In the FIG. 7 case, the self-redundancy control circuit 32 comprises a timing pulse generating controller 551 for controlling all functions of the redundancy control circuit 32 in accordance with the self-redundancy sequence; a write/read/erase control circuit 553 for operating the EEPROM 503; a redundancy address register 555 storing replacement address data (redundancy address data); a register 557 storing the replacement address data read from the EEPROM 503; a comparator 559 for comparing the replacement address data stored in the register 555 with the replacement address data stored in the register 557 to thereby output a comparison result indicating whether or not normal writing has been performed; a register group 563 including registers (RE1–REn) which respectively store comparison results output from the comparator 559; a transfer circuit 561 for sequentially transferring the comparison results to the registers (RE1–REn); and a comparator 565 for comparing the comparison results stored in the registers (RE1–REn), with each other, thereby outputting a comparison result indicating whether or not all the comparison results are identical to each other.

The operation of the redundancy control circuit 32 of FIG. 7 will be described.

First, replacement address data RADI is input to the operation control circuit 553 and the register 555. The register 555 stores the input data RADI. Then, the controller 551 supplies a write command CMW to the operation control circuit 553. The operation control circuit 553, in turn, outputs a write signal for writing the data RADI, to that cell included in the EEPROM 503 which corresponds to the input replacement address data RADI. Specifically, writing of the data RADI is performed by repeating, a predetermined number of times, output of that write pulse included in the write signal which is supplied to the control gate of the cell of the EEPROM.

After repeatedly outputting the write pulse, the controller 551 supplies the operation control circuit 553 with a read command CMR. The operation control circuit 553, in turn, outputs a read signal for reading the written replacement address data RADO from the EEPROM 503. The read data RADO is input to and stored in the register 557.

Thereafter, the controller 551 supplies output commands CMO1 and CMO2 to the register 555 and the register 557, respectively. The register 555 responds to the output command CMO1, thereby outputting the replacement address data (to-be-written data) RADI stored therein. Similarly, the register 557 responds to the command CMO2, thereby outputting the replacement address data (actually written data) RADO stored therein. The comparator 559 compares the data RADI with the data RADO, and serially outputs comparison results CP1/CF1 indicating whether the to-be-written data is identical to the actually written data. For example, if the to-be-written data is "0101" and the actually written data is "0101", the comparator 559 outputs a comparison result CP1 indicative of identification, whereas if the former is not identical to the latter, the comparator 559 outputs a comparison result CF1 indicative of non-identification.

Subsequently, the controller 551 supplies a transfer command CMTR to the transfer circuit 561. The transfer circuit 561, in turn, transfers the comparison result CP1/CF1 to a first register RE1 included in the register group 563. The first register RE1 stores a first comparison result CP1.

The above-described processing is performed until all items of the replacement address data RADI are written into the EEPROM 503 (the above processing corresponds to that performed in the steps ST.23 and ST.24 in FIG. 5). Second et seq. comparison results CP1/CF1 are sequentially stored in second et seq. registers RE2, RE3 . . . REn.

After all items of the replacement address data RADI are written into the EEPROM 503, the controller 551 supplies an output command CMO3 to the register group 563. In response to the output command CMO3, the register group 563 simultaneously outputs all the comparison results CP1/CF1 in a parallel manner from the registers RE1–REn, and supplies them to the comparator 565. The comparator, in turn, compares the comparison results CP1/CF1 with each other, and outputs a comparison result CP3/CF3 indicative of whether or not all to-be-written data items are identical to all actually written data items. The comparator 565 outputs, for example, a logical product (AND) of the comparison results registered in the registers RE1–REn. As a result, the comparator 565 outputs a comparison result CF3 indicative of non-identification only if all the comparison results contain at least one result CF1 indicative of non-identification. The comparison results CP3/CF3 are input to the controller 551 (the above processing corresponds to that performed in the step ST.25 in FIG. 6). As is shown in FIG. 7, a monitor line 567 may be provided for guiding the comparison result CP3/CF3 to the outside of the device.

Then, the controller 551 determines whether or not each of the input comparison results is CP3 indicative of identification or CF3 indicative of non-identification (this processing corresponds to that performed in the step ST.26 in FIG. 6). If the input comparison result is PC3 indicative of identification, the controller 551 determines that the self-redundancy processing is terminated, and causes the program to proceed to the step ST.27 in FIG. 6. If, on the other hand, the input comparison result is PF3 indicative of non-identification, the number of occasions in which data is rewritten is incremented and then compared with a predetermined number of rewrite occasions (this processing corresponds to the step ST.29 in FIG. 6). If the predetermined number of writing occasions is reached, it is determined that the self-redundancy processing is terminated, and the program proceeds to the step ST.27 in FIG. 6. If the predetermined number of writing occasions is not reached, the controller 551 supplies an erase command CME to the operation control circuit 553, which in turn outputs an erase signal for performing flash erase of the data stored in the EEPROM 503.

After the data is erased, the controller 551 again performs redundancy processing in accordance with the redundancy sequence. As a result, the replacement address data RADI is rewritten in the EEPROM 503.

The above-described controller/large-scale memory mixed type semiconductor integrated circuit device according to the embodiment of the invention can be modified, for example, in manners stated below.

The CPU 20 may incorporate some components of the internal self-tester 3, i.e. the self-test control circuit (CONT.T) 30 for controlling/executing self-test processing, the self-redundancy control circuit (CONT.R) 32 for controlling/executing self-redundancy processing, and the data comparison circuit (COMP.) 36 for judging the test results.

The self-test pattern can be voluntarily formed so that it would serve as a general matching or checking board, or a test pattern capable of detecting various defective modes. Writing the voluntarily formed test pattern into the memory 34 enables the large-capacity memory 1 to be self-tested using the pattern.

The test sequence and the redundancy sequence may be simultaneously written into the memory 34.

Since in the controller/large-scale memory mixed type semiconductor integrated circuit device of the embodiment, the internal self-tester 3 and the large-scale memory 1 as the main memory are provided on a single chip, the tester 3 can follow extremely high speed transfer of a great amount of data from the main memory.

Further, since the controller 2 and the internal self-tester 3 included in a logic circuit are tested separately from the large-scale memory 1 as a memory circuit, programs (test sequences) for generating test patterns can be developed for the logic circuit and the memory circuit, respectively. This is much easier than the development of a program capable of testing both circuits.

Moreover, since the test sequence and the redundancy sequence are stored in the rewritable self-test memory 34, the test sequence can be modified. Accordingly, the device of the invention can flexibly deal with modification of software (test sequence) required to follow yearly improvements in manufacturing process.

Although a BIST (Built-In Self Test) circuit is generally known as a self-tester circuit, the device of the invention is much superior to the BIST circuit in that it can flexibly deal with modification of software (test sequence) required to follow yearly improvements in manufacturing process. The BIST circuit is a ROM, and accordingly software cannot be modified unless the BIST circuit is modified in an initial stage of its manufacturing process. This means that the BIST circuit cannot flexibly deal with modification of software.

Since in the device of the embodiment of the invention, test sequences can be used for the logic circuit and the memory circuit, respectively, each of the test sequences (i.e. programs) can be modified much easier than a single test sequence (i.e. a program) for testing both circuits. In addition, in the case of using respective test sequences for both circuits, they can be modified such that they will individually reflect requests, if any, of the designers of the logic circuit and the memory circuit.

Since the large-scale memory 1 as the main memory is examined directly without passing a test signal through the controller 2, satisfactorily accurate examination results can be obtained. Further, since it is not necessary to consider an error which may occur because of passing a test signal through the controller 2, the clear conditions can be lowered, thereby lowering the possibility of occurrence of a great amount of defective products. As a result, degradation of the yield can be restrained. Of course, it is also not necessary to prepare a test pad which enables the main memory to be examined from the outside.

Furthermore, since the controller/large-scale memory mixed type semiconductor integrated circuit device of the embodiment has a self-redundancy function, the time required for redundancy processing in the case where the main memory has a megabyte-order memory capacity can be restrained. Specifically, the self-redundancy function can finish the redundancy processing in a much shorter time than in the case where a large number of fuses are blown by a laser blower. Further, since the self-redundancy function does not require any redundancy equipment such as a laser blower, it can restrain the plant investment.

In a device having a redundancy circuit of a fuse-blow type, a blow error, if occurred, cannot be repaired. On the other hand, in the device of the invention with a redundancy circuit of an EEPROM type, a program error corresponding to the blow error can be repaired by rewriting data. Therefore, the yield of products is much higher than in the case of the device of the fuse-blow type.

By virtue of the above-described advantages, the controller/large-scale memory mixed type semiconductor integrated circuit device of the embodiment can enhance the yield of products and the production efficiency, and reduce the required plant investment.

The controller/large-scale memory mixed type semiconductor integrated circuit device of the embodiment has the programmable self-test memory 34. If the memory 34 is used as a working memory of the device after the test sequences and redundancy sequence stored therein are erased, the memory 34 is effectively used as a programmable memory.

Also, if a defective area of the main memory is replaced with the redundancy memory in units of a block including a plurality of rows or columns, the time required for redundancy processing can be more shortened.

As described in the section "Description of the Related Art", this invention has been made in a process where an "On-board" circuit for personal computers is developed into an "On-chip" circuit.

However, that structure employed in the device of the invention, in which, for example, a self-test sequence for examining the main memory is written into the programmable self-test memory 34 formed on a chip in order to examine the main memory in accordance therewith, is also applicable to a one-chip microcomputer, etc., which is available at present.

Even when the above structure of the invention is applied to the one-chip microcomputer, it can provide advantages similar to the aforementioned ones—the advantage that test sequences can be used for a logic circuit such as the CPU and a memory circuit such as the main memory, respectively, and the advantage that even when the self-test sequence is modified, self-test processing can be performed in accordance with the modified self-test sequence without altering the circuit or the manufacturing process.

Moreover, although the CPU of the controller/large-scale memory mixed type semiconductor integrated circuit device corresponds to that of the one-chip microcomputer, they greatly differ, for example, in that the former mainly performs high-speed transfer of data stored in the main memory to the outside, while the latter mainly performs calculation on the basis of data (programs) stored in the main memory.

As described above, the present invention can provide a controller/large-scale memory mixed type semiconductor integrated circuit device which can be produced with a high yield, a high production efficiency and a low plant investment, and also provide a test method for testing the device.

Furthermore, the invention can provide a controller/large-scale memory mixed type semiconductor integrated circuit device capable of testing itself without changing its circuit and manufacturing process, using a test sequence included in software even if the software is modified.

In addition, the invention can provide a method for testing a controller/large-scale memory mixed type semiconductor integrated circuit device having a logic circuit and a memory circuit, in accordance with respective test sequences included in software even if the software is modified, without changing its circuit and manufacturing process.

Additional advantages and modifications will readily occur to those skilled in the art. Therefore, the invention in its broader aspects is not limited to the specific details, representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a semiconductor chip;
   a main memory provided on the chip;
   a controller provided on said chip for controlling at least inputting data from the outside of said chip to said main memory, and outputting data from said main memory to the outside of said chip; and
   a self-test circuit provided on said chip and having a memory into which a self-test sequence is written, said self-test circuit testing said main memory in accordance with the self-test sequence written in the memory.

2. The semiconductor integrated circuit device according to claim 1, wherein said memory permits data to be written therein and to be erased therefrom.

3. The semiconductor integrated circuit device according to claim 1, wherein said self-test circuit obtains a fail address stored in said main memory by testing said main memory, and causes another memory provided on said chip to store the fail address.

4. The semiconductor integrated circuit device according to claim 3, wherein said another memory is a buffer memory included in said controller.

5. The semiconductor integrated circuit device according to claim 3, wherein said main memory includes a redundancy circuit, and said self-test circuit includes a self-redundancy control circuit for assigning an address corresponding to the fail address, to said redundancy circuit to thereby save the fail address in said main memory.

6. The semiconductor integrated circuit device according to claim 5, wherein said redundancy circuit includes a redundancy memory cell array, and a replacement data memory in which address replacement data is written and stored, the replacement data memory causing said redundancy memory cell array to be operable, on the basis of the stored address replacement data.

7. The semiconductor integrated circuit device according to claim 6, wherein said replacement data memory permits data to be written therein and to be erased therefrom.

8. The semiconductor integrated circuit device according to claim 7, wherein said redundancy circuit further includes a register for storing redundancy fail address data, and a comparator for comparing the redundancy address data stored in said register with the address replacement data stored in said replacement data memory.

9. The semiconductor integrated circuit device according to claim 8, wherein said self-redundancy control circuit erases the address replacement data stored in said replacement data memory when said comparator determines that the redundancy address data is not identical to the address replacement data, and again writes the address replacement data into said replacement data memory.

10. The semiconductor integrated circuit device according to claim 1, further comprising a comparator for comparing test data stored in said memory of said self-test circuit with data output from said main memory, thereby determining whether a memory cell included in said main memory is considered "Pass" or "Fail", and outputting one of determination signals.

11. The semiconductor integrated circuit device according to claim 10, wherein said memory of said self-test circuit outputs a test address signal to said main memory and said another memory, and said another memory stores the test address signal only when said comparator outputs that one of the determination signals which indicates that the memory cell is considered "Fail".

12. The semiconductor integrated circuit device according to claim 11, further comprising a monitor line for outputting the output of said comparator to the outside of said chip.

13. A method for testing a semiconductor integrated circuit device having, on a semiconductor chip, at least a main memory; a controller for controlling at least inputting data from the outside of said chip to said main memory, and outputting data from said main memory to the outside of said chip; a rewritable memory different from said main memory, in which the data can be rewritten; a memory different from said main memory and said rewritable memory; a redundancy circuit including a redundancy memory cell array, and a replacement data memory for causing said redundancy memory cell array to be operable on the basis of address replacement data stored therein; a self-test circuit for testing said main memory in accordance with a self-test sequence written in said rewritable memory, and causing said memory to store a fail address included in the main memory and obtained by the test; a self-redundancy control circuit for assigning an address corresponding to the fail address in the main memory, to said redundancy memory cell array of said redundancy circuit in accordance with a self-redundancy control sequence written in said rewritable memory, to thereby save the fail address, the method comprising the steps of:

testing at least said controller, said memory, said rewritable memory, said self-test circuit and said self-redundancy on the basis of external test signals output from an external tester; and writing into said rewritable memory a self-test sequence output from said external tester, and testing at least said main memory in accordance with the written self-test sequence on the basis of an internal test signal supplied from said self-test circuit.

14. The method according to claim 13, further comprising the step of writing into said rewritable memory a self-redundancy sequence output from said external tester, and saving the fail address stored in said main memory by means of said self-redundancy circuit in accordance with the written self-redundancy sequence.

15. The method according to claim 14, wherein the fail address is stored in said memory anytime during self-testing said main memory.

16. The method according to claim 13, wherein said redundancy circuit further includes a register for storing fail address data, and a comparator for comparing address replacement data stored in said register with address replacement data actually stored in said replacement data memory, the address replacement data stored in said replacement data memory being erased when said comparator determines that the fail address data is not identical to the address replacement data, and the address replacement data being rewritten into said replacement data memory.

17. The method according to claim 13, wherein an address corresponding to the fail address included in said main memory is assigned to that cell block included in said redundancy memory cell array, which consists of a plurality of rows or columns, thereby performing address replacement.

18. A method for using a semiconductor integrated circuit device having, on a semiconductor chip, at least a main memory; a controller for controlling at least inputting data from the outside of said chip to said main memory, and outputting data from said main memory to the outside of said chip; and a self-test circuit for testing said main memory in accordance with a self-test sequence written in a rewritable memory different from said main memory, the method comprising the steps of:

erasing the self-test sequence from said rewritable memory after self-test processing is finished; and using said rewritable memory as a working memory after the self-test sequence is erased therefrom.

19. A semiconductor integrated circuit device comprising:

a semiconductor chip;

a main memory provided on said chip;

a calculation circuit provided on said chip for performing at least calculation on the basis of data stored in said main memory;

a rewritable memory provided on said chip and different from said main memory; and a self-test circuit provided on said chip for writing a self-test sequence into said rewritable memory, and testing said main memory in accordance with the written self-test sequence.

20. A method for testing a semiconductor integrated circuit device having, on a semiconductor chip, at least a main memory, a calculation circuit for performing at least calculation on the basis of data stored in said main memory, and a rewritable memory different from said main memory, the method comprising the steps of:

testing at least said calculation circuit by means of an external tester; and writing a self-test sequence into said rewritable memory, and testing said main memory in accordance with the written self-test sequence.

* * * * *